United States Patent
Achi et al.

(10) Patent No.: US 9,851,487 B2
(45) Date of Patent: Dec. 26, 2017

(54) BACKLIGHT DEVICE

(71) Applicant: NICHIA CORPORATION, Anan-shi, Tokushima (JP)

(72) Inventors: Yusaku Achi, Tokushima (JP); Daisuke Iwakura, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 100 days.

(21) Appl. No.: 14/794,644

(22) Filed: Jul. 8, 2015

(65) Prior Publication Data

US 2016/0011354 A1    Jan. 14, 2016

(30) Foreign Application Priority Data

Jul. 9, 2014   (JP) ................................. 2014-141522

(51) Int. Cl.
   *G02B 6/00*   (2006.01)
   *F21V 8/00*   (2006.01)

(52) U.S. Cl.
   CPC ........... *G02B 6/002* (2013.01); *G02B 6/0068* (2013.01); *G02B 6/009* (2013.01); *G02B 6/0085* (2013.01)

(58) Field of Classification Search
   CPC ...... G02B 6/002; G02B 6/0068; G02B 6/009; G02B 6/0026; G02B 6/0091
   See application file for complete search history.

(56) References Cited

U.S. PATENT DOCUMENTS

| | | | | |
|---|---|---|---|---|
| 7,553,061 B2 * | 6/2009 | Chang | ................... | G02B 6/0028 349/65 |
| 8,506,151 B2 * | 8/2013 | Park | ................... | G02F 1/133603 362/613 |
| 8,538,217 B2 * | 9/2013 | Li | ................... | A61B 1/0653 362/556 |
| 8,882,330 B2 * | 11/2014 | Byun | ................... | F21S 8/00 362/249.04 |
| 9,214,608 B2 * | 12/2015 | Kunz | ................... | H01L 33/50 |
| 2008/0151527 A1 * | 6/2008 | Ueno | ................... | C09K 11/584 362/84 |
| 2010/0053064 A1 | 3/2010 | Hamada | | |
| 2012/0188746 A1 * | 7/2012 | Lee | ................... | B29D 11/00634 362/84 |

(Continued)

FOREIGN PATENT DOCUMENTS

| | | |
|---|---|---|
| JP | 2004-177890 A | 6/2004 |
| JP | 2007-207615 A | 8/2007 |

(Continued)

*Primary Examiner* — Peggy Neils
(74) *Attorney, Agent, or Firm* — Foley & Lardner LLP

(57) ABSTRACT

A backlight device includes a light guide plate including a first incident surface, and one or more second incident surfaces that are connected to the first incident surface and inclined with respect to the first incident surface in a top plan view; at least one green illuminant arranged to face one of (i) the first incident surface and (ii) the one or more second incident surfaces; and at least one red illuminant arranged to face the other of (i) the first incident surface and (ii) the one or more second incident surfaces. At least one of (i) the green light emitted from the green illuminant, and (ii) the red light emitted from the red illuminant, contains a blue component whose emission peak wavelength is 420 nm to 500 nm.

20 Claims, 9 Drawing Sheets

(56) References Cited

U.S. PATENT DOCUMENTS

| | | | |
|---|---|---|---|
| 2012/0281155 A1* | 11/2012 | Takano | G02B 6/0068 348/790 |
| 2012/0300494 A1 | 11/2012 | Watabe et al. | |
| 2013/0027616 A1* | 1/2013 | Takata | G02F 1/133514 348/725 |
| 2013/0278650 A1 | 10/2013 | Takahashi et al. | |
| 2014/0285997 A1 | 9/2014 | Nitta et al. | |

FOREIGN PATENT DOCUMENTS

| | | |
|---|---|---|
| JP | 2008-140704 A | 6/2008 |
| JP | 2008-181579 A | 8/2008 |
| JP | 2009-016127 A | 1/2009 |
| JP | 2009-076656 A | 4/2009 |
| JP | 2012-248293 A | 12/2012 |
| JP | 2013-089434 A | 5/2013 |
| WO | WO-2008/065765 A1 | 6/2008 |
| WO | WO-2011/125356 A1 | 10/2011 |
| WO | WO-2012/124509 A1 | 9/2012 |
| WO | WO-2014/080562 A1 | 5/2014 |

* cited by examiner

BACKLIGHT DEVICE

CROSS-REFERENCE TO RELATED APPLICATIONS

The present application claims priority under 35 U.S.C. §119 to Japanese Patent Application No. 2014-141522, filed on Jul. 9, 2014. The content of this application is incorporated herein by reference in its entirety.

BACKGROUND OF THE INVENTION

1. Field of the Invention

The present disclosure relates to a backlight device.

2. Description of Related Art

A conventional backlight device is disclosed in WO2011/125356 A. This backlight device includes a light guide plate having an incident surface, and first illuminants and second illuminants arranged so as to face the incident surface.

The first illuminants emit light that contains a blue component and a green component of the three primary colors, and the second illuminants emit light that contains a blue component and a red component of the three primary colors. Further, the light from the first illuminants and the light from the second illuminants respectively have predetermined directivity angles. Accordingly, the overlapping portions of the light from the first illuminants and the light from the second illuminants are mixed with each other in the light guide plate, and a white light is emitted from the light guide plate.

However, in operation of such a conventional backlight device, as shown in FIG. 9, the respective predetermined directivity angles of the light emitted from the first illuminants 101 and the light emitted from the second illuminants 102 create a region A at an incident surface 111 side of the viewing surface of the light guide plate 110 where the light (shown by broken-line arrows) from the first illuminants 101 and the light (shown by solid-line arrows) from the second illuminants 102 do not overlap with each other, causing uneven color of light on the incident surface 111 side of the light guide plate 110. The region A is shown by hatching in FIG. 9.

Accordingly, an object of an embodiment of the present invention is to provide a backlight device that can suppress color unevenness on the incident surface side of the light guide plate.

SUMMARY OF THE INVENTION

A backlight device according to an embodiment of the present invention includes: a light guide plate including a first incident surface, and one or more second incident surfaces that are connected to the first incident surface and inclined with respect to the first incident surface in a top plan view; at least one green illuminant arranged to face one of (i) the first incident surface and (ii) the one or more second incident surfaces, the at least one green illuminant being configured to emit a green light toward said one of (i) the first incident surface and (ii) the one or more second incident surfaces; and at least one red illuminant arranged to face the other of (i) the first incident surface and (ii) the one or more second incident surfaces, the at last one red illuminant being configured to emit a red light toward said other of (i) the first incident surface and (ii) the one or more second incident surfaces. At least one of (i) the green light emitted from the green illuminant, and (ii) the red light emitted from the red illuminant, contains a blue component whose emission peak wavelength is 420 nm to 500 nm.

In the backlight device according to the embodiment of the present invention, the green illuminant is arranged to face one of the first incident surface and the second incident surface, and the red illuminant is arranged to face the other of the first incident surface and the second incident surface. Accordingly, the area where the light from the green illuminant and the light from the red illuminant mix with each other and produce a white light can be arranged closer to the first incident surface. Accordingly, color unevenness on the first incident surface side of the light guide plate can be suppressed.

DETAILED DESCRIPTION OF EMBODIMENTS

Embodiments of the present invention will be described in detail below with reference to the drawings.

First Embodiment

Figure 1:
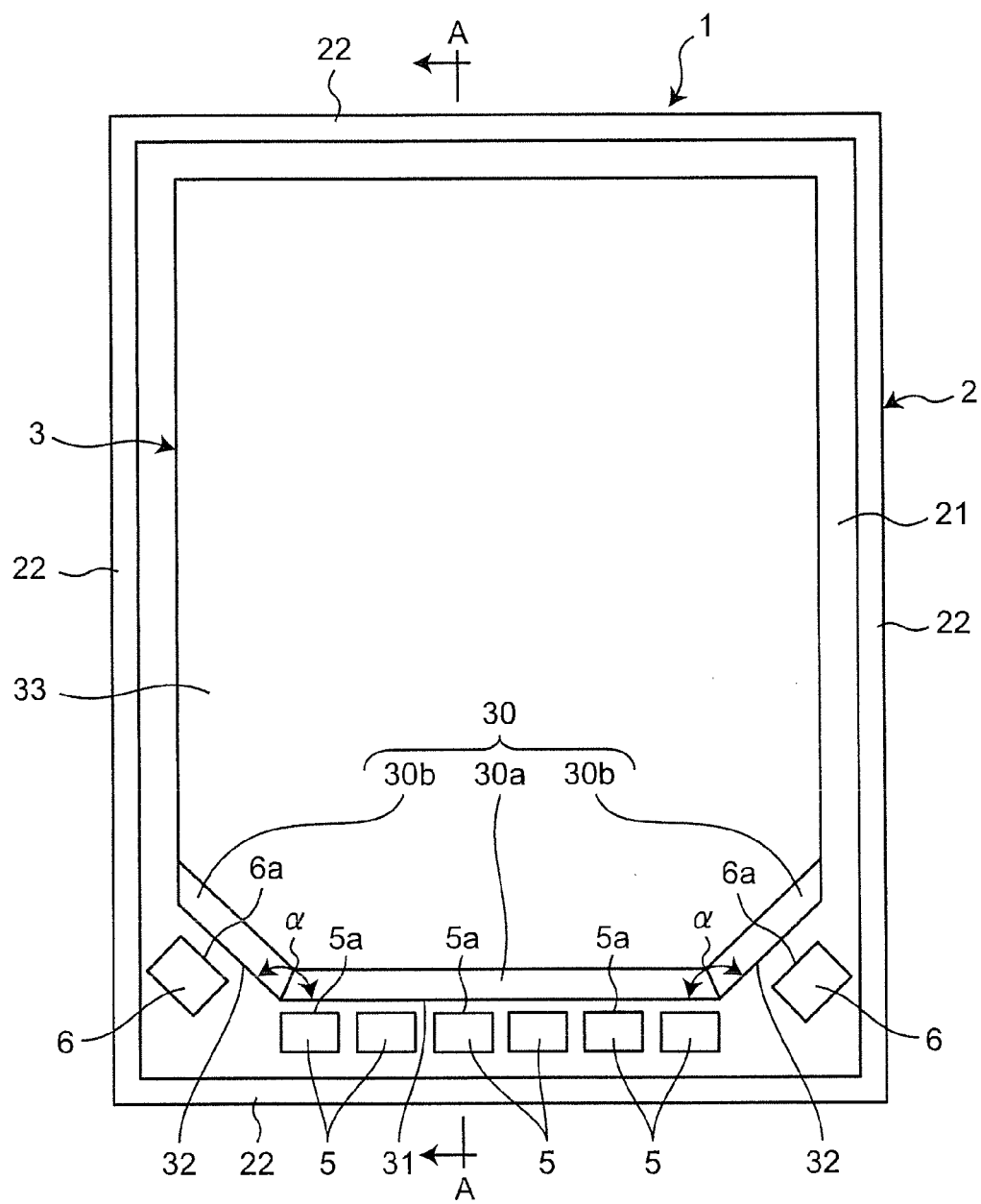
FIG. 1 is a schematic plan view showing a backlight device according to a first embodiment of the present invention.
Figure 2:
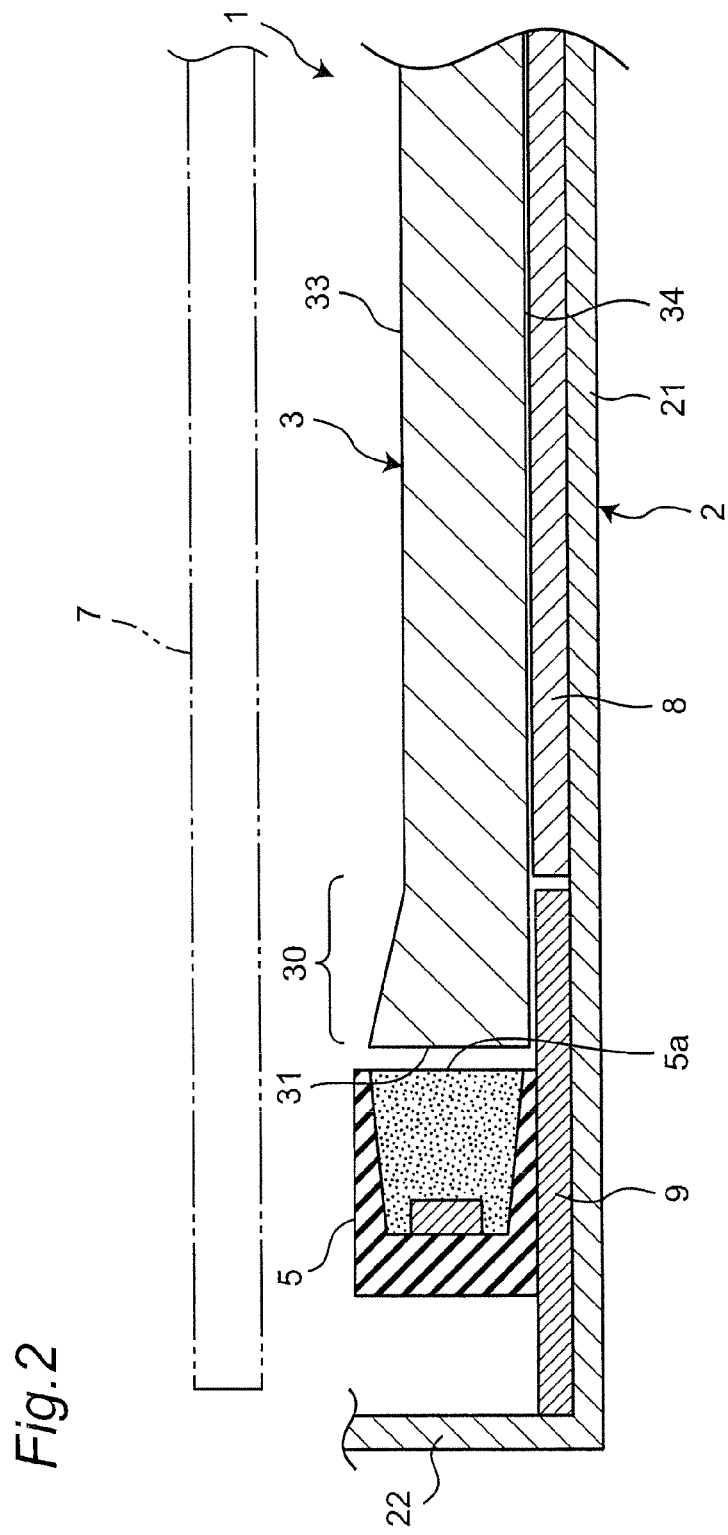
FIG. 2 is a cross-sectional view taken along line A-A in FIG.

FIG. 1 is a schematic plan view showing a backlight device according to a first embodiment of the present invention. FIG. 2 is a cross-sectional view taken along line A-A in FIG. 1. As shown in FIGS. 1 and 2, a backlight device 1 includes a case 2, a light guide plate 3 arranged in the case 2, and green illuminants 5 and red illuminants 6 arranged in the case 2 to emit light to the light guide plate 3. The backlight device 1 illuminates a liquid crystal panel 7 of a smartphone or the like with the light from the green illuminants 5 and the light from the red illuminants 6, via the light guide plate 3.

In the present embodiment, the description will be given of the case where the backlight device 1 is used for a smartphone, but the backlight device 1 may be used for a mobile terminal device such as a tablet, or for an electronic device such as a television set or a computer.

The light guide plate 3 has a first incident surface 31 and two second incident surfaces 32 respectively formed at both lateral ends of the first incident surface 31. The second incident surfaces 32 are each inclined toward the first incident surface 31 with respect to the first incident surface 31 by a predetermined inclination angle $\alpha$ in a top plan view. The light guide plate 3 is formed in a substantially rectangular shape in a plan view. The first incident surface 31 is formed at one side of the rectangle, and the second incident surfaces 32 are formed at the corners adjacent to said one side of the rectangle.

A plurality of green illuminants 5 are arranged to face the first incident surface 31. A red illuminant 6 is arranged to face each of the second incident surfaces 32. The green illuminants 5 are configured to emit a green light toward the first incident surface 31, and the red illuminants 6 are configured to emit a red light toward the second incident surfaces 32 respectively. Further, at least one of the light emitted from the green illuminants 5 and the light emitted from the red illuminants 6 contains a blue component whose emission peak wavelength is in a range of 420 nm to 500 nm. Further, in FIG. 2, a light-emitting surface 5a of each green illuminant 5 is spaced apart from its corresponding first incident surface 31, but the light-emitting surface 5a of the green illuminant 5 may be in close proximity to the first incident surface 31 which allows prevention of light leaking at the first incident surface 31, and thus light extracting efficiency of the backlight device 1 can be improved. This can also be applied similarly to the relationship between a light-emitting surface 6a of each red illuminant 6 and its corresponding second incident surface 32.

In FIG. 1, the green illuminants 5 are arranged to face the first incident surface 31, and the red illuminants 6 are arranged to face the second incident surfaces 32 respectively. But the configuration is not limited to the above; for example, the red illuminants 6 may be arranged to face the first incident surface 31, and the green illuminants 5 may be arranged to face the second incident surfaces 32 respectively. One or more of the green illuminant 5 and one or more of the red illuminant 6 may be arranged to face a same incident surface (the first incident surface 31 or one or more of the second incident surfaces 32). Thus, the light emitted from a light emitting surface 33 of the light guide plate 3 can be adjusted to achieve the required color reproducibility.

Figure 7:
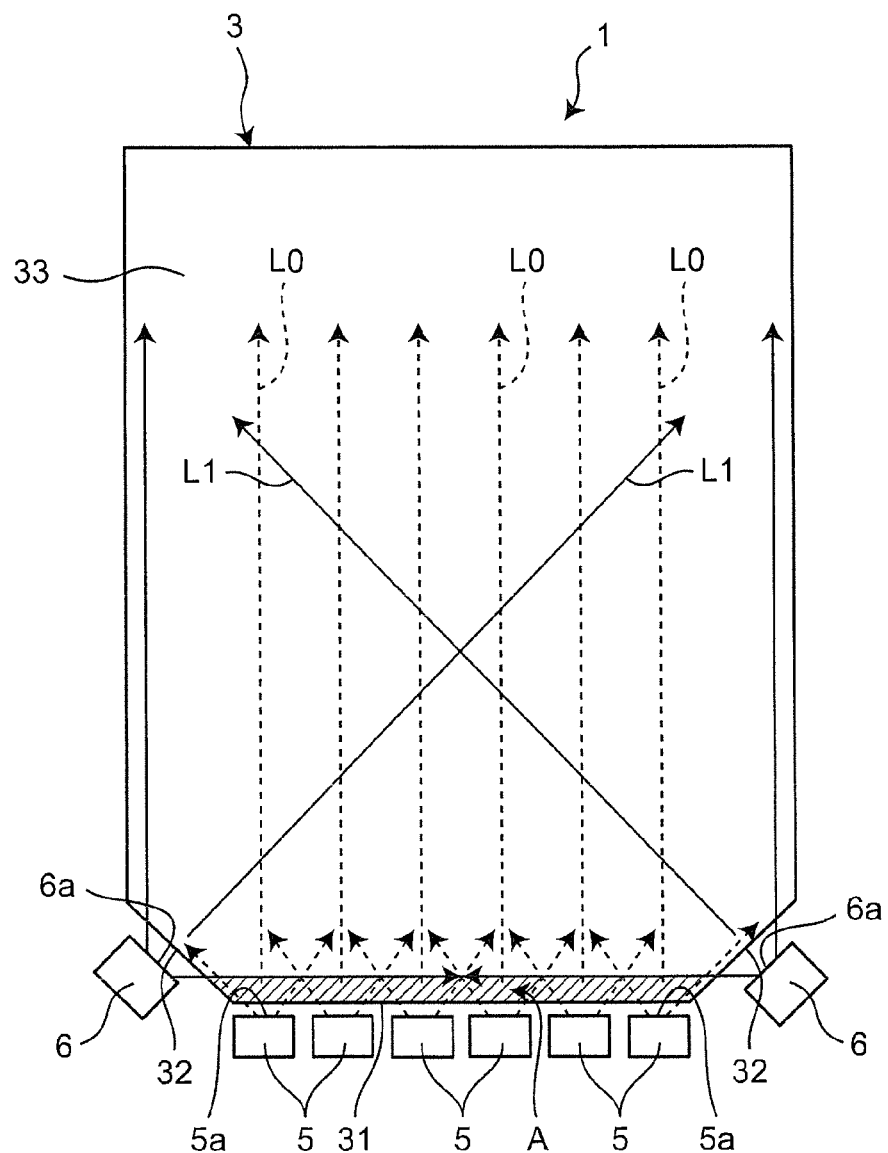
FIG. 7 is an explanatory diagram for describing the operation of the backlight device according to the first embodiment of the present invention.

FIG. 7 is a schematic diagram for illustrating the operation of the backlight device 1. As shown in FIG. 7, the second incident surfaces 32 are each inclined toward the first incident surface 31 in a top plan view, so that the optical axes L1 of the light from the red illuminants 6 are inclined relative to the optical axes L0 of the light from the green illuminants 5, and the optical axes L1 of the light from the red illuminants 6 intersects the optical axes L0 of the light from the green illuminants 5. That is, the optical axes L1 of the light from the red illuminants 6 are inclined toward the first incident surface 31 relative to a direction perpendicular to the first incident surface 31.

In this manner, arranging the optical axes L1 of the light from the red illuminants 6 inclined toward the first incident surface 31 allows for the region where the red light (the solid-line arrows) and the green light (the broken-line arrows) mix with each other can be arranged closer to the first incident surface 31 of the light guide plate 3. Accordingly, the region where the red component (the red illuminants 6), the green component (the green illuminants 5) and the blue component (contained in at least one of the light emitted from the green illuminant 5 and the light emitted from the red illuminant 6) of the three primary colors mix with one another to produce a white light can be directed closer to the first incident surface 31. Thus, the backlight device 1 with improved color unevenness can be provided. Note that, in practical operation, the uneven-color region A shown in FIG. 7 can be covered by a frame member that surrounds the liquid crystal panel 7 of the smartphone, so that the region does not serve as the effective region that illuminates the liquid crystal panel 7.

In the present specification, as shown in FIG. 1, the inclination angle $\alpha$ of each second incident surface 32 with respect to the first incident surface 31 is determined by a relation with the directivity angle of the light from each red illuminant 6. That is, the inclination angle $\alpha$ is determined so that the light from the red illuminant 6 can be directed closer to the first incident surface 31. As the directivity angle of the light from each red illuminant 6 becomes smaller, the inclination angle $\alpha$ becomes smaller.

For example, the inclination angle $\alpha$ is preferably $0°<\alpha<180°$, and more preferably, $90°<\alpha<180°$. With this arrangement, the region of a white light obtained by mixing colors in the vicinity of the first incident surface 31 of the light guide plate 3 can be increased while reducing the uneven-color region at the first incident surface side of the light guide plate 3.

For example, assuming the directivity angle of the light from each red illuminant 6 is 90°, the inclination angle $\alpha$ of each second incident surface 32 with respect to the first incident surface 31 is preferably 135°. In this manner, the light from the red illuminants 6 can be directed closer to the first incident surface 31.

The second incident surfaces 32 are arranged at the corners of the light guide plate 3, so that compared to the first incident surface 31, the space for arranging the illuminants is not easily provided. In other words, the space for arranging the illuminants can be easily provided in the first incident surface 31, for example, so that a plurality of illuminants of low light-emitting intensity can be arranged. Accordingly, in view of the above, in the present embodiment, at the first incident surface 31 side where the space can be easily provided, for example, a plurality of green illuminants 5 of low light-emitting intensity can be arranged, and at the second incident surface 32 side where the space cannot be easily provided, for example, a single red illuminant 6 of high light-emitting intensity is arranged. Thus, a white light obtained by efficiently mixing colors of light through efficient use of the space can be emitted via the light emitting surface 33.

Further, in the case where the light-emitting intensity of the green illuminants 5 is greater than the light-emitting intensity of the red illuminants 6, the red illuminants 6 may be arranged so as to oppose to the first incident surface 31 and the green illuminants 5 may be arranged so as to oppose to the second incident surfaces 32. Further, in the case where the space can be sufficiently provided at each of the second incident surfaces 32, a plurality of illuminants (the green illuminants 5 or the red illuminants 6) may be arranged so as to face each second incident surface 32.

In the following, a description will be given of a preferable mode of the backlight device 1 according to the present embodiment.

(Case 2)

The case 2 can be made of, for example, a resin. As shown in FIGS. 1 and 2, the case 2 includes a base plate 21 and side plates 22 that are integrally provided to the circumference of the base plate 21. The base plate 21 has a substantially rectangular shape in a plan view. Four of the side plates 22 are included and respectively integrally attached to the four sides of the base plate 21.

(Light Guide Plate 3)

The light guide plate 3 can be made of, for example, an acrylic resin or a polycarbonate resin. The light guide plate 3 has a substantially rectangular shape in a plan view. The light guide plate 3 includes the first incident surface 31, the two second incident surfaces 32, and the light emitting surface 33. The first incident surface 31 is positioned at the side surface of the first side (the short side in FIG. 1) of the rectangle of the light guide plate 3 in a plan view. The light emitting surface 33 is positioned at the upper surface of the light guide plate 3.

The second incident surfaces 32 are positioned at the corner portions of the light guide plate 3. The second incident surfaces 32 are positioned at lateral both ends of the first incident surface 31. The second incident surfaces 32 are each inclined toward the first incident surface 31 with respect to the first incident surface 31 in a top plan view. In other words, each second incident surface 32 is inclined relative to the first incident surface 31 such that the optical axis L1 of the light from each red illuminant 6 intersects the optical axis L0 of the light from each green illuminant 5.

The two second incident surfaces 32 are arranged such that the first incident surface 31 is arranged between them. Specifically, the two second incident surfaces 32 are each placed between and continuously connected to the first incident surface 31 and one of the side surfaces of the second sides (the long sides in FIG. 1) of the rectangular shape of the light guide plate 3 in a plan view.

With the backlight device 1 shown in FIG. 1, six of the green illuminants 5 are employed (there may be more or less than six), and the six green illuminants 5 are arranged to face the first incident surface 31, adjacent to one another along the first incident surface 31. The light-emitting surface 5a of each green illuminant 5 are arranged to face the first incident surface 31, and configured to emit green light toward the first incident surface 31. The light emitted from the green illuminants 5 may contain a blue component whose emission peak wavelength is 420 nm to 500 nm. As shown in FIG. 2, the green illuminants 5 are attached to the upper surface of a substrate 9, and the substrate 9 is attached to the upper surface of the base plate 21 of the case 2.

Two of the red illuminants 6 are employed (they may be greater or smaller than two), and are arranged to face the two second incident surfaces 32 respectively. The light-emitting surface 6a of each red illuminant 6 face to the corresponding second incident surface 32, and configured to emit red light toward the second incident surface 32. The light emitted from the red illuminants 6 may contain a blue component whose emission peak wavelength is 420 nm to 5.00 cm. The red illuminants 6 are attached to the upper surface of the substrate 9, and the substrate 9 is attached to the upper surface of the base plate 21 of the case 2.

Note that the number of the green illuminants 5 and the red illuminants 6 can be determined in view of the ratio between the light-emitting intensity of each green illuminant 5 and that of each red illuminant 6.

As shown in FIG. 2, between a lower surface 34 of the light guide plate 3 and the upper surface of the base plate 21 of the case 2, a reflective sheet 8 and the substrate 9 are arranged. The substrate 9 overlaps an end portion 30 of the light guide plate 3. The end portion 30 includes a first end portion 30a on the first incident surface 31 side and a second end portion 30b on the second incident surface 32. The reflective sheet 8 overlaps substantially the entire region of the light guide plate 3 except for the first end 30 side.

The liquid crystal panel 7 is arranged to face the light emitting surface 33 of the light guide plate 3. Between the liquid crystal panel 7 and the light emitting surface 33, an optical sheet such as a diffusion sheet, a prism sheet, a polarizing sheet or the like may be arranged.

(Green Illuminant 5)

Figure 3A:
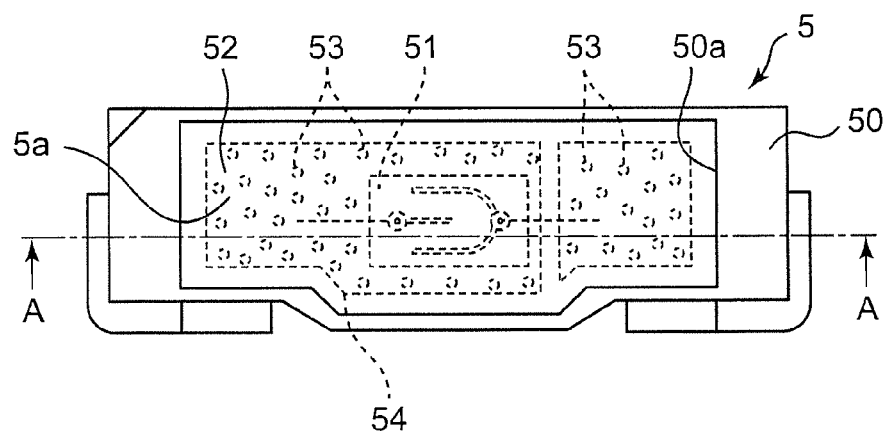
FIG. 3A is a schematic front view of a green illuminant of the backlight device according to the first embodiment of the present invention as seen from a light-emitting surface side.
Figure 3B:
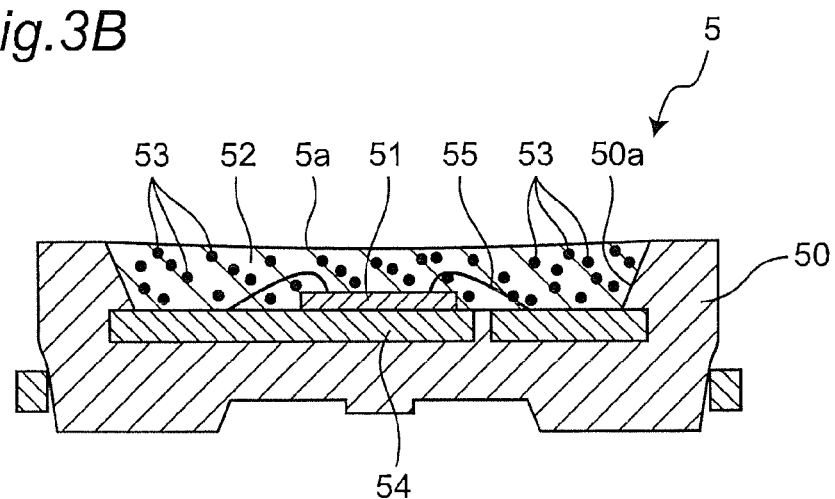
FIG. 3B is a cross-sectional view taken along line A-A in FIG. 3A.

FIG. 3A is a schematic front view of the green illuminant 5 as seen from the light-emitting surface 5a side. FIG. 3B is a cross-sectional view taken along line A-A in FIG. 3A. As shown in FIGS. 3A and 3B, the green illuminant 5 includes a package 50, a light-emitting element 51, a sealing resin 52, and a green fluorescent material 53. The green illuminant 5 is configured to emit a green light that satisfies, for example, ($0 < x < 0.4$ and $0.05 < y < 0.9$) in the CIE color diagram. Preferably, the green illuminant 5 emits light that satisfies ($0.1 < x < 0.3$ and $0.4 < y < 0.6$) in the CIE color diagram.

The package 50 shown in FIGS. 3A and 35 defines a recess 50a. At the bottom of the recess 50a, a lead frame 54 is arranged. The package 50 and the lead frame 54 are integrally molded. The package 50 can be made of, for example, a thermoplastic resin such as a PPA (polyphthalamide), a PPS (polyphenylene sulfide), a liquid crystal polymer, and a nylon, or a thermosetting resin such as an epoxy resin, a silicone resin, a modified epoxy resin, a modified silicone resin, a urethane resin, and an acrylate resin. Alternatively, the package 50 may be made of a glass epoxy resin, ceramics, or a glass. Note that, as ceramics, it is particularly preferable to employ alumina, aluminum nitride, mullite, silicon carbide, silicon nitride or the like. The lead frame 54 can be made of a metal such as iron, copper, copper-iron alloy, copper-tin alloy, and copper-, gold-, silver-plated aluminum, iron, copper and the like.

The directivity angle of the light output from the package 50 can be adjusted by adjusting the angle of the inner side wall of the recess 50a. Alternatively, it can be adjusted by forming a lens by using a sealing resin 52 to be described below, or by using other material, in an appropriate shape.

Figure 4:
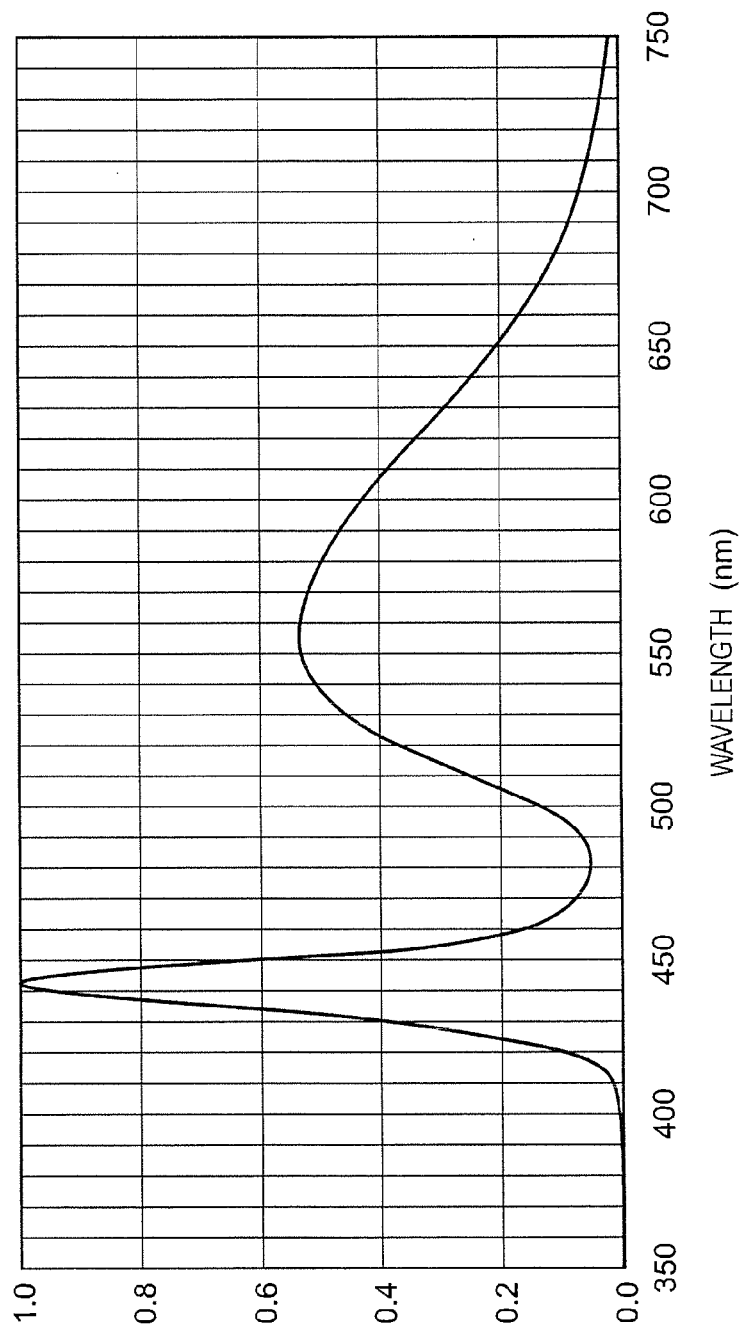
FIG. 4 is a diagram showing an emission spectrum in which a red component and a blue component are contained.

One of the green illuminants 5 and the red illuminants 6 to be described below contains a blue component. For example, FIG. 4 shows an emission spectrum including a red component and a blue component. The blue component as used herein may be a blue light-emitting element provided in the package 50. Alternatively, it may be a blue fluorescent material to emit a blue light upon excited (in this case, presence of a light-emitting element or the like that can excite the blue fluorescent material is required).

The light-emitting element 51 is arranged in the recess 50a of the package 50. The light-emitting element 51 is attached on the lead frame 54. The light-emitting element 51 is electrically connected to the lead frame 54 via a wire 55. The light-emitting element 51 is, for example, a blue light-emitting element configured to emit a blue light. As the blue light-emitting element, for example, a nitride-based semiconductor ($In_xAl_yGa_{1-x-y}N$, $0 \leq x$, $y$, $x+y \leq 1$) light-emitting element is preferable. Note that, for the light-emitting element 51, an ultraviolet light-emitting element may be used other than such a blue light-emitting element. In the case of using an ultraviolet light-emitting element, an ultraviolet light-emitting element of 250 nm to 380 nm can efficiently excite the fluorescent materials of a red fluorescent material, a blue fluorescent material, and a green fluorescent material. Accordingly, the colors of light can be mixed to emit a white light.

The sealing resin 52 is arranged in the recess 50a of the package 50 to seal the light-emitting element 51. The sealing resin 52 can be made of a light-transmissive resin. The light-transmissive resin may be, for example, a resin that can exhibit excellent weather resistance, such as silicone resin, epoxy resin, urea resin, fluororesin, and hybrid resin containing at least one of the foregoing resins. Further, instead of such a resin, the sealing member may be an inorganic material that can exhibit excellent light-resistance such as glass, silica gel or the like. In order for the sealing resin 52 to have a predetermined function, at least one material selected from the group consisting of filler, a diffusing agent, pigment, a fluorescent substance, and a reflective substance may be mixed with the sealing resin 52. The sealing member may contain a diffusing agent. As the specific diffusing agent, barium titanate, titanium oxide, aluminum oxide, silicon oxide or the like can be preferably used. Further, for the purpose of blocking an undesired wavelength, the sealing member may contain an organic or inorganic coloring dye or coloring pigment.

Further, the sealing member may contain a fluorescent substance that can absorb light from the light-emitting elements 51 and converts its wavelength.

The green fluorescent material 53 is a granular fluorescent material, and contained in the sealing resin 52. The green fluorescent material 53 can be excited by at least a part of the light emitted from the light-emitting element 51 to emit a green light. The green fluorescent material 53 may be, for example, a chlorosilicate fluorescent material such as $Ca_6MgSi_4O_{16}Cl_2$:Eu, a β-type sialon fluorescent material such as $Si_{6-z}Al_zO_zN_{8-z}$:Eu, or an LAG-base fluorescent material activated by Ce. Of other exemplary fluorescent materials, an oxynitride fluorescent material that can be activated mainly by a lanthanoide-base element such as Eu, Ce or the like, can be employed.

Figure 5A:
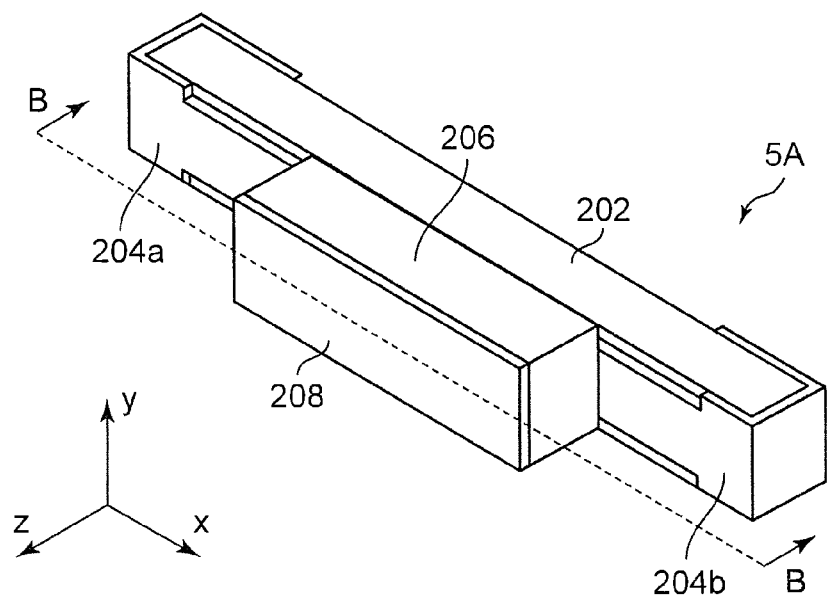
FIG. 5A is a schematic perspective view of a green illuminant of a variation of the backlight device according to the first embodiment of the present invention.
Figure 5B:
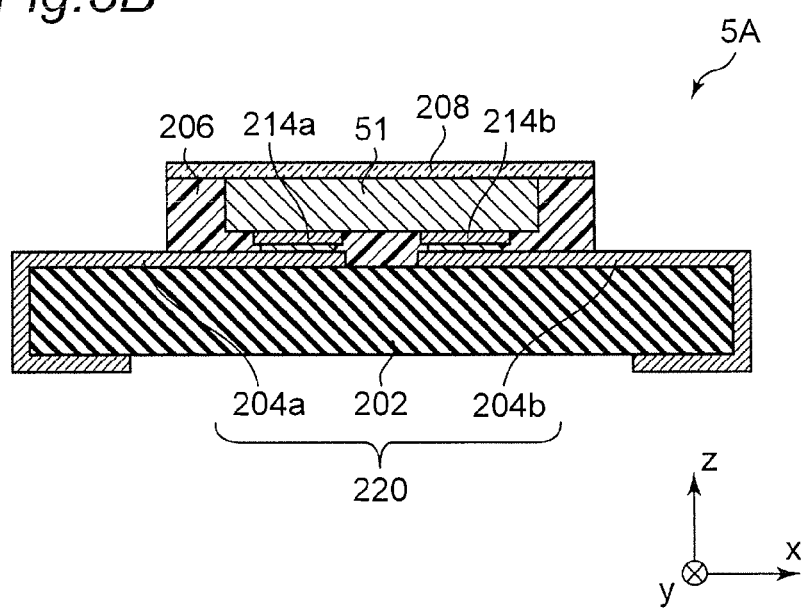
FIG. 5B is a cross-sectional view taken along line B-B in FIG. 5A.

As shown in FIGS. 5A and 5B, a green illuminant 5A of according to another embodiment does not include the recess 50a shown in FIGS. 3A and 3B. The green illuminant 5A can include a base member 220 which includes an insulator 202 and external connection terminals 209a and 204b, the light-emitting element 51 placed on the base member 220, a light-blocking member 206 coating the side wall of the light-emitting element 51, and a fluorescent material layer 208 that at least coats the light-emitting surface of the light-emitting element 51. The light-emitting element 51 is electrically connected to the external connection terminals 204a and 204b via electrodes 214a and 214b of the light-emitting element 51.

Since such a green illuminant 5A does not include the recess 50a as shown in FIGS. 3A and 3B, the width of the light-emitting element 51 (the width in Y direction in FIG. 5A) can approximate the width of the green illuminant 5A (the width in Y direction in FIG. 5A). Accordingly, the light-emitting element 51 of the green illuminant 5A can be increased in size as compared to the light-emitting element 51 of the green illuminant 5 having the recess 50a. Therefore, the green illuminant 5A with a further improved light beam can be provided.

Figure 6:
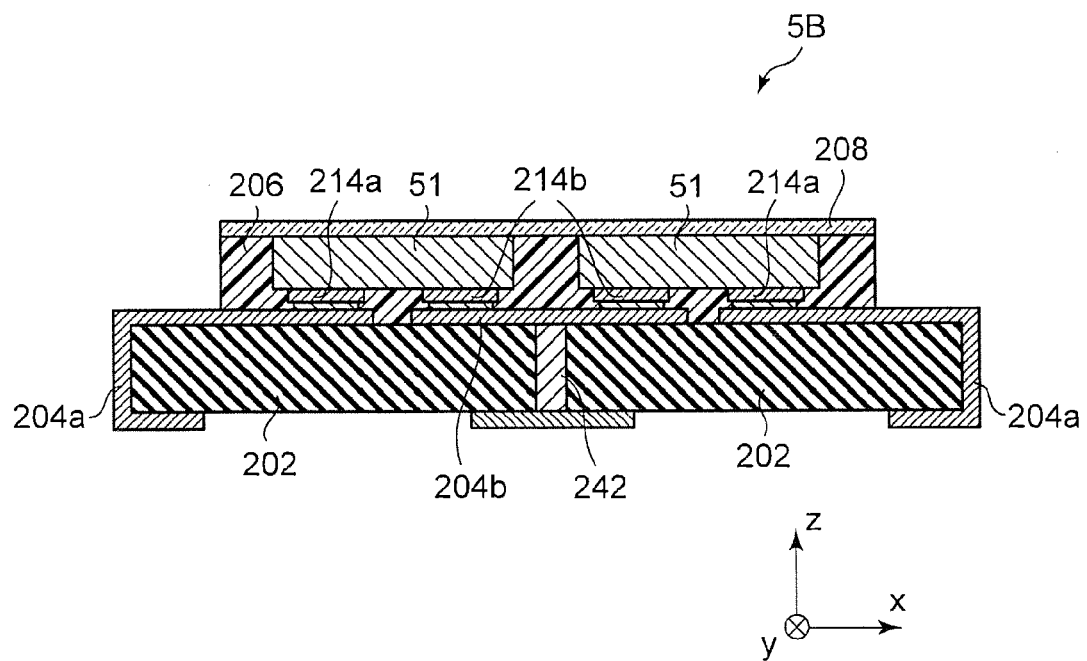
FIG. 6 is a schematic cross-sectional view of a green illuminant of a variation of the backlight device according to the first embodiment of the present invention.

Further, FIG. 6 shows a green illuminant 5B of an another embodiment. The green illuminant 5B is different from the green illuminant 5A shown in FIGS. 5A and 5B in that a plurality of light-emitting elements 51 are provided, and a metal member 242 is formed between two insulators 202 and 202. Since a plurality of light-emitting elements 51 are provided in a single green illuminant 5B, the width of the green illuminant 5B (the width in X direction in FIG. 6) can be reduced, and the region where the green illuminant 5B is placed can be reduced in size. Further, forming the metal member 242 between the two insulators 202 and 202 allows for releasing the heat from the light-emitting element 51 to the outside via the metal member 242.

In connection with the green illuminant 5B, since the width of the green illuminant 5B (the width in Y direction in FIGS. 5B and 6) can be reduced adjusting to the light-emitting element 51, the green illuminant 5B is suitable to a thin backlight device. Further, in the embodiments, the second incident surfaces 32 are positioned at the corner portions of the light guide plate 3, so that it is difficult to increase the number of the illuminants arranged to face the second incident surfaces 32. Even in such a case, a green illuminant 5B including a plurality of light-emitting elements 51 can be used at a narrow region. Consequently, the light-emitting intensity at the second incident surfaces 32 can be improved.

(Red Illuminant 6)

The red illuminant 6 includes a package 60, a light-emitting element 61, a sealing resin 62, and a red fluorescent material 63. The package 60, the light-emitting element 61, and the sealing resin 62 may be similar to those of the green illuminant 5 as to the material and structure. The red illuminant 6 can emit a red light that satisfies, for example, ($0.3<x<0.7$ and $0.1<y<0.4$) in the CIE color diagram. Preferably, the red illuminant 6 can emit a light that satisfies ($0.4<x<0.6$ and $0.1<y<0.3$) in the CIE color diagram.

The red fluorescent material 63 can be a granular fluorescent material, and contained in the sealing resin 62. The red fluorescent material 63 can be excited by at least a part of the light emitted by the light-emitting element 61, to emit a red light. The red fluorescent material 63 may be, for example, an SCASN-base fluorescent material such as (Sr, Ca)$AlSiN_3$:Eu, a CASN-base fluorescent material such as $CaAlSiN_3$:Eu, $Ca_2Si_5N_8$:Eu, $SrAlSiN_3$:Eu an α-type sialon fluorescent material activated by Eu. Further, any fluorescent materials other than the fluorescent materials noted above having similar performance, operation and effect can also be employed. Still further, a silicate-based fluorescent material activated by Eu may be employed.

In the case where an ultraviolet light-emitting element is employed as the light-emitting element (the light-emitting element 51 or the light-emitting element 61), a blue fluorescent material may be provided in the package (the package 50 or the package 60). As the blue fluorescent material in this case, a fluorescent material whose emission peak wavelength falls within the range of 430 nm to 460 nm can be employed. In particular, it is preferable to use an europium-activated chlorophosphate fluorescent material having the composition expressed by Formula (1).

General formula: $(Sr_{1-x-y-z}Ba_xCa_yEu_z)_5 (PO_4)_3.Cl$ . . . (1) (where x, y, and z are the numbers that satisfy $0≤x<0.5$, $0≤y<0.1$, $0.005<z<0.1$). The blue fluorescent material having the composition expressed by Formula (1) can produce a blue light that exhibits excellent light emission efficiency.

The above-described fluorescent materials of various types (of green, red, and blue) may be quantum dots. A quantum dot is a particle whose major axis is about 1 nm to 100 nm, and has a discrete energy level. Since the energy state of the quantum dot depends on its size, the emission wavelength can be freely selected by varying the size. Further, the light emitted by the quantum dots has narrow spectrum width. By combining light beams of a sharp peak, the color range can be widened. Accordingly, by using quantum dots as the fluorescent materials of various types, the color range can be widened easily. Further, the quantum dots have excellent responsiveness, and therefore the light of the light-emitting elements can be efficiently used. In addition, the quantum dots are highly stable. A quantum dot may be, for example, a compound of a Group 12 element and a Group 16 element, a compound of a Group 13 element and a Group 16 element, or a compound of a Group 14 element and a Group 16 element. For example, it may be CdSe, CdTe, ZnS, CdS, PbS, PbSe, CdHgTe or the like. As the quantum nanostructure materials, other than the quantum dots, quantum rods or the like can also be employed.

Next, a description will be given of the operation of the backlight device 1.

As shown in FIG. 7, a green light is emitted from a plurality of green illuminants 5 toward the first incident surface 31 of the light guide plate 3. The light emitted from the green illuminants 5 propagates in the light guide plate 3 toward the opposite side relative to the first incident surface 31 of the light guide plate 3 with a predetermined directivity angle, as represented by broken-line arrows in the drawing.

Further, a red light is emitted from the red illuminants 6 toward the second incident surfaces 32 of the light guide plate 3. The light emitted from the red illuminants 6 propagates in the light guide plate 3 toward the opposite sides of the second incident surfaces 32 of the light guide plate 3 with a predetermined directivity angle, as represented by solid-line arrows in the drawing.

Then, the light from the green illuminants 5 and the light from the red illuminants 6 mix with each other in the light guide plate 3. At least one of the green light emitted from the green illuminants 5 and the red light emitted from the red illuminant 6 contains a blue component. Accordingly, by the light from the green illuminants 5 and the light from the red illuminants 6 mixing with each other, a white light is produced.

Figure 9:
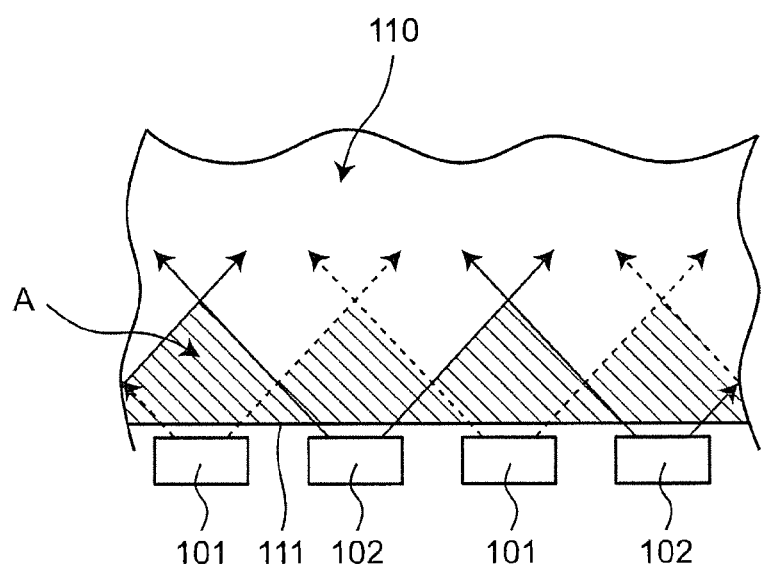
FIG. 9 is an explanatory diagram showing a conventional backlight device.

At this time, as described above, the second incident surfaces 32 are inclined toward the first incident surface 31 with respect to the first incident surface 31 in a top plan view, the optical axes L1 of the light from the red illuminants 6 can be directed closer to the first incident surface 31. Thus, the region A where the light from the green illuminants 5 and the light from the red illuminants 6 do not overlap can be reduced as compared to the region A in the conventional technique (FIG. 9). Accordingly, color unevenness at the first incident surface 31 side of the light guide plate 3 can be suppressed.

Thereafter, as shown in FIG. 2, the light that has become white inside the light guide plate 3 is emitted from the light emitting surface 33 of the light guide plate 3. At this time, a part of the light inside the light guide plate 3 may also be released from the lower surface 34 of the light guide plate 3, but the light leaked from the lower surface 34 can be reflected by the reflective sheet 8 that faces the lower surface 34, and emitted from the light emitting surface 33. Then, the light emitted from the light emitting surface 33 irradiates a liquid crystal panel 7 via an optical sheet such as a diffusion sheet, a prism sheet, or a polarizing sheet. Note that, the uneven-color region A shown in FIG. 7 is, in a practical operation, covered with the frame member that surrounds the liquid crystal panel 7 of the smartphone. Therefore, the region A will not be the effective area for illuminating the liquid crystal panel 7.

According to the embodiment described above, the red light emitted from the red illuminants 6 can be directed closer to the first incident surface 31 of the light guide plate 3, and the region where the red light mixes with the green light can be arranged closer to the first incident surface 31. Accordingly, the region where a white light is produced by mixing of a red, a green and a blue lights can be made closer to the first incident surface 31, so that the color unevenness on the first incident surface 31 side of the light guide plate 3 can be suppressed.

According to the embodiment described above, as compared to a conventional backlight device X in which a blue light-emitting element and a yellow-color fluorescent material (for example, a YAG-base fluorescent material) are combined, a wider color range can be expressed. The conventional backlight device X does not have much green and red components, and an improvement in color reproducibility is difficult. In contrast, with the embodiment described above, since the red, green, and blue components of the three primary colors are contained, color reproducibility can be highly improved as compared to the conventional backlight device X.

Further, according to the embodiment described above—as compared to a backlight device Y in which a blue light-emitting element, a red fluorescent material and a green fluorescent material are provided in an identical package—a brighter backlight device with low loss in light can be provided. That is, in the backlight device Y, the green light excited by the light emitted from the blue light-emitting element is absorbed by the red fluorescent material, and hence a loss in light occurs. In contrast, according to the embodiment described above, the red fluorescent material and the green fluorescent material are arranged in separate packages, so that such loss in light because of the absorption spectrum of the fluorescent material can be prevented.

According to the embodiment described above, two second incident surfaces 32 are employed, which are arranged interposing the first incident surface 31 therebetween. According to this arrangement, the red illuminants 6 respectively emit red light toward the two second incident surfaces 32. Thus, the output of the red light can be enhanced at both sides of the first incident surface 31, whereby color unevenness can further be suppressed.

According to the embodiment described above, even in the case where the light-emitting intensity of the green light emitted from the green illuminants 5 is smaller than the light-emitting intensity of the red light emitted from the red illuminants 6, with a plurality of green illuminants 5, the light-emitting intensity of the green light in the light guide plate 3 can be enhanced. Further, the space on the first incident surface 31 side can be easier to provide than the second incident surface 32 side, so that a plurality of green illuminants 5 can be arranged on this first incident surface 31 side. Accordingly, the space can be efficiently used.

Second Embodiment

Figure 8:
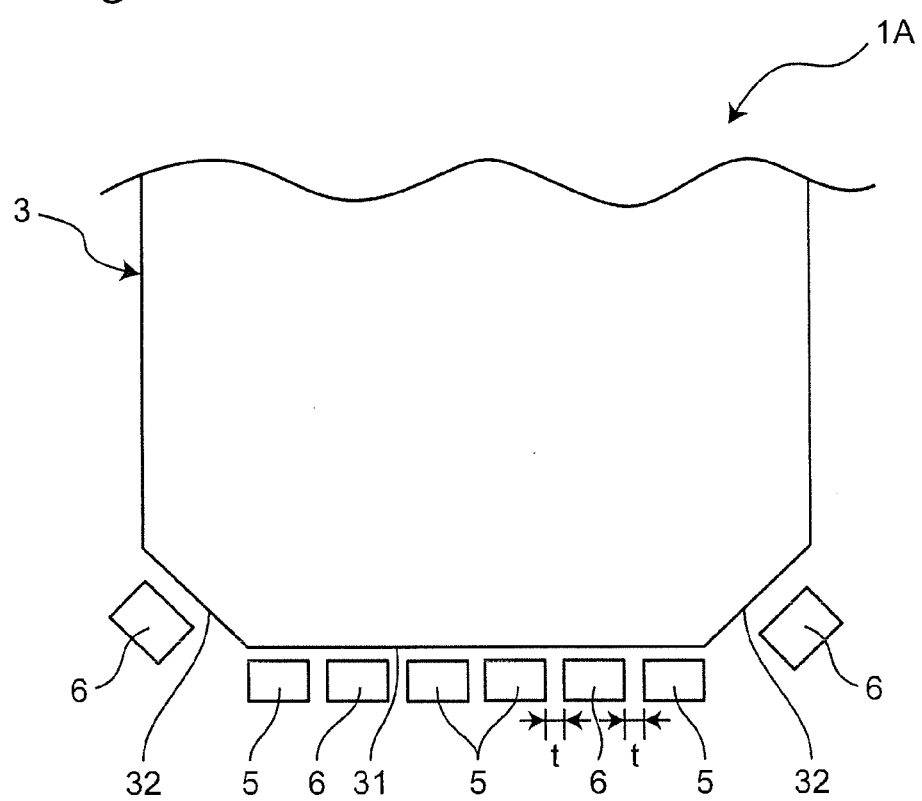
FIG. 8 is a schematic plan view showing a backlight device according to a second embodiment of the present invention.

FIG. 8 is a schematic plan view showing a backlight device according to a second embodiment of the present invention. The second embodiment is different from the first embodiment in the arrangement of the illuminants that oppose to the first incident surface 31. In the following, the difference in the structure will be mainly described. Note that, in the second embodiment, since the elements bearing the identical reference marks as in the first embodiment are identically structured as in the first embodiment, the description thereof will not be repeated.

As shown in FIG. 8, in a backlight device 1A according to the second embodiment, the red illuminants 6 are further arranged to face the first incident surface 31, in addition to those arranged at the second incident surfaces 32 of the light guide plate 3. In the backlight device 1A in FIG. 8, although the number of the red illuminants 6 that face the first incident surface 31 is two, the number of the red illuminants 6 that face the first incident surface 31 may be one or three or more.

In the backlight device 1A in FIG. 8, the illuminants facing the first incident surface 31 are provided as follows, in order from one second incident surface 32 to other second incident surface 32: the green illuminant 5, the red illuminant 6, two green illuminants 5, the red illuminant 6, and the green illuminant 5. Each of the red illuminants 6 is positioned between the two green illuminants 5. The arrangement of the illuminants is not limited thereto, and can be in any manner taking into consideration of the light-emitting intensity of the illuminants.

In this manner, by arranging the red illuminants 6 among the illuminants opposing to the first incident surface 31, the red component can be increased.

Further, an interval t between the green illuminant 5 and the red illuminant 6 arranged to face the first incident surface 31 is preferably 1.3 mm to 3.5 mm, for example in the case where the width of each illuminant facing the first incident surface 31 is 1.5 mm to 2.0 mm. With this arrangement, the light emitted from adjacent illuminants can be efficiently mixed, and the backlight device 1A with little color unevenness can be provided.

Note that, the present invention is not limited to the embodiments described above, and can be modified within a range not deviating from the gist of the present invention. For example, the characteristics of the first and second embodiments may be combined in various manners.

In the embodiments described above, two of the second incident surfaces 32 are employed at the lateral both ends of the first incident surface 31. However, the second incident surface 32 may be one arranged at one lateral end of the first incident surface 31. Alternatively, the second incident surface 32 may be provided at a position along the first incident surface 31 in addition to the lateral ends of the first incident surface 31, or three or more of the second incident surfaces 32 may be provided.

In the embodiments described above, a plurality of slits may be provided at the surface of each first incident surface 31 or each second incident surface 32. Each of the slits is a through hole formed to extend from the light emitting surface 33 of the light guide plate 3 to the lower surface 34. The shape of the slit can be, for example, a cutaway of an arc-shaped surface or a polygonal surface in a plan view. With the use of such slits, the light incident on the incident surfaces can be diffused inside the light guide plate. In the embodiments described above, particularly the illuminants arranged to face the second incident surfaces 32 are needed to deliver the light from the region near the first incident surface 31 to the surface opposite to the first incident surface 31. Accordingly, it is preferable to provide the slits on the surface of the second incident surfaces 32, because the light of the illuminants arranged to face the second incident surfaces 32 can be easily scattered through the entire light guide plate 3.

In the embodiments described above, fine uneven surface preparation may be provided at the inclined upper surface of the first end portion 30a of the light guide plate 3 (for example, the region where the upper surface is inclined in the light guide plate 3 shown in FIG. 2). As shown in FIG. 2, the height of the upper surface of the first end 30 is greater than the height of the light emitting surface 33. Therefore, a part of the light directly output from the illuminants to the upper surface of the first end 30 may leak without mixing with each other. However, by allowing the upper surface of the first end 30 to be uneven, light leakage from the upper surface of the first end can be prevented. Other than the uneven surface preparation, the surface may be processed to have a fine radial prism structure. Each of the second end portions 30b may be similarly structured. In particular, the second incident surfaces 32 are positioned at the corner portions of the light guide plate 3, so that the space for arranging the illuminants that face the incident surface is not easily provided. Accordingly, it is preferable to provide the uneven processing at the inclined upper surfaces of the second end portions 30b, because the light from the illuminants can be efficiently guided inside the light guide plate 3.

Further, the light guide plate 3 shown in FIG. 2 is formed by, in order from the first end 30, the inclined surface and a low horizontal surface continuously formed from the inclined surface. Except for this manner, for example, it is also possible to employ a light guide plate formed by, for example in order from the first end 30, a high horizontal surface, an inclined surface continuously formed from the high horizontal surface, and a low horizontal surface continuously formed from the inclined surface. In this case, the inclined surface may be provided with the unevenness similarly to the manner described above.

In the embodiments described above, as the optical sheet, an optical sheet using quantum nanostructure materials may further be provided. The optical sheet using quantum nanostructure materials is, for example, a film-like sheet in which phosphorous quantum dots having green or red emission spectrum are diffused in a polymer base member. In the embodiments described above, even in the case where the green component or the red component is insufficient in the light emitted from the green illuminants 5 or the red illuminants 6, the green component or the red component can be supplemented by providing the optical sheet to the light guide plate 3. Thus, the mixed light can approximate a white light. Further, in the foregoing, the optical sheet that supplements the green or red has been described, the present invention is not limited thereto and an optical sheet that supplements blue, other color, or a color produced by a combination of any of the foregoing may be employed.

In the embodiments described above, the green illuminant 5 comprises a blue light-emitting element and a green fluorescent material, and the red illuminant 6 comprises a blue light-emitting element and a red fluorescent material. But, the green illuminant 5 may comprise a green light-emitting element, and a red illuminant 6 may comprise a red light-emitting element. In this case, one of the light emitted from the green illuminant 5 and the light emitted from the red illuminant 6 must contain a blue component whose emission peak wavelength is 420 nm to 500 nm (for example, a blue light-emitting element or a blue fluorescent material).

In the embodiments described above, a plurality of green illuminants 5 facing the first incident surface 31 are provided. However, a single green illuminant 5 can be employed Further, in the embodiment described above, a single red illuminant 6 that faces a single second incident surface 32 is employed. However, a plurality of red illuminants 6 that face a single second incident surface 32 can be employed. Further, both the green illuminant 5 and the red illuminant 6 may be arranged to face the identical incident surface.

In the embodiments described above, the light-emitting element used in the green illuminant 5 and the red illuminant 6 is a blue light-emitting element or an ultraviolet light-emitting element. However, any light-emitting element can be used so long as it emits light containing the blue component.

What is claimed is:

1. A backlight device comprising:
a light guide plate including:
a top light emitting surface,
a lateral first incident surface, and
one or more lateral second incident surfaces,
wherein the one or more second incident surfaces are connected to the first incident surface and inclined with respect to the first incident surface in a top plan view;
at least one green illuminant arranged to face one of (i) the first incident surface and (ii) the one or more second incident surfaces, the at least one green illuminant being configured to emit a green light toward said one of (i) the first incident surface and (ii) the one or more second incident surfaces; and
at least one red illuminant arranged to face the other of (i) the first incident surface and (ii) the one or more second incident surfaces, the at last one red illuminant being configured to emit a red light toward said other of (i) the first incident surface and (ii) the one or more second incident surfaces,
wherein at least one of (i) the green light emitted from the green illuminant, and (ii) the red light emitted from the red illuminant, contains a blue component whose emission peak wavelength is 420 nm to 500 nm.

2. The backlight device according to claim 1, wherein:
the light guide includes the two of the second incident surfaces, and
said the first incident surface is arranged between said two of the second incident surfaces.

3. The backlight device according to claim 1, wherein at least one of the green illuminant and the red illuminant includes a blue light-emitting element.

4. The backlight device according to claim 1, wherein one or more of the at least one green illuminant and one or more of the at least one red illuminant are arranged to face one of the first incident surface and the second incident surface.

5. The backlight device according to claim 1, wherein:
one or more of the at least one green illuminant and one or more of the at least one red illuminant are arranged to face the first incident surface, and among the illuminants arranged to face the first incident surface, an interval between between the green illuminant and the red illuminant is 1.3 mm to 3.5 mm.

6. The backlight device according to claim 1, wherein the green illuminant is configured to emit a green light that satisfies, (0<x<0.4 and 0.05<y<0.9) in a CIE color diagram.

7. The backlight device according to claim 1, wherein the red illuminant is configured to emit a red light that satisfies, (0.3<x<0.7 and 0.1<y<0.4) in a CIE color diagram.

8. The backlight device according to claim 1, wherein the green illuminant includes at least one green fluorescent material selected from the group consisting of a β-type sialon fluorescent material, a chlorosilicate fluorescent material and an LAG fluorescent material.

9. The backlight device according to claim 1, wherein the red illuminant includes at least one red fluorescent material selected from the group consisting of a CASN fluorescent material, an SCASN fluorescent material, and a KSF fluorescent material.

10. A backlight device comprising:
a light guide plate including:
a top light emitting surface,
a lateral first incident surface, and
one or more lateral second incident surfaces,
wherein the one or more second incident surfaces are connected to the first incident surface and inclined with respect to the first incident surface in a top plan view;
at least one first illuminant arranged to face the first incident surface, and configured to emit a first light toward the first incident surface; and
at least one second illuminant arranged to face the one or more second incident surfaces, and configured to emit a second light that is different from the first light toward the one or more second incident surfaces.

11. The backlight device according to claim 10, wherein the first illuminant is a green illuminant configured to emit a green light, and the second illuminant is a red illuminant configured to emit a red light.

12. The backlight device according to claim 11, wherein at least one of the light emitted from the green illuminant and the light emitted from the red illuminant contains a blue component whose emission peak wavelength is 420 nm to 500 nm.

13. The backlight device according to claim 10,
wherein the light guide plate includes two of the second incident surfaces, and
said the first incident surface is arranged between said two of the second incident surfaces.

14. The backlight device according to claim 12, wherein at least one of the green illuminant and the red illuminant includes a blue light-emitting element.

15. The backlight device according to claim 11, wherein one or more of the at least one green illuminant and one or more of the at least one red illuminant are arranged to face one of the first incident surface and the second incident surface.

16. The backlight device according to claim 15, wherein:
one or more of the at least one green illuminant and one or more of the at least one red illuminant are arranged to face the first incident surface, and
among the illuminants arranged to face the first incident surface, an interval between between the green illuminant and the red illuminant is 1.3 mm to 3.5 mm.

17. The backlight device according to claim 11, wherein the green illuminant is configured to emit a green light that satisfies, (0<x<0.4 and 0.05<y<0.9) in the CIE color diagram.

18. The backlight device according to claim 11, wherein the red illuminant is configured to emit a red light that satisfies, (0.3<x<0.7 and 0.1<y<0.4) in the CIE color diagram.

19. The backlight device according to claim 11, wherein the green illuminant includes at least one green fluorescent material selected from the group consisting of a β-type sialon fluorescent material, a chlorosilicate fluorescent material and an LAG fluorescent material.

20. The backlight device according to any one of claim 11, wherein the red illuminant includes at least one red fluorescent material selected from the group consisting of a CASN fluorescent material, an SCASN fluorescent material, and a KSF fluorescent material.

* * * * *

UNITED STATES PATENT AND TRADEMARK OFFICE
CERTIFICATE OF CORRECTION

PATENT NO.       : 9,851,487 B2
APPLICATION NO.  : 14/794644
DATED            : December 26, 2017
INVENTOR(S)      : Yusaku Achi and Daisuke Iwakura Page 1 of 1

It is certified that error appears in the above-identified patent and that said Letters Patent is hereby corrected as shown below:

In the Claims

Column 14, Line 42:
Please replace "an interval between between the green" with -- an interval between the green --.

Signed and Sealed this
Fourth Day of September, 2018

Andrei Iancu
*Director of the United States Patent and Trademark Office*